United States Patent
Hsu et al.

(10) Patent No.: US 7,456,141 B2
(45) Date of Patent: Nov. 25, 2008

(54) PHOTO RESIST STRIPPER COMPOSITION

(75) Inventors: Ming-Ann Hsu, Taoyuan (TW);
Kuang-Lung Kuo, Taoyuan (TW);
Mu-Lin Tsai, Taoyuan (TW); Sing-Ru Dai, Taoyuan (TW)

(73) Assignee: Echem Solutions Corp. (TW)

( * ) Notice: Subject to any disclaimer, the term of this patent is extended or adjusted under 35 U.S.C. 154(b) by 298 days.

(21) Appl. No.: 11/109,406

(22) Filed: Apr. 19, 2005

(65) Prior Publication Data

US 2006/0100116 A1    May 11, 2006

(30) Foreign Application Priority Data

Nov. 5, 2004 (TW) .............................. 93134044 A

(51) Int. Cl.
*C11D 7/50* (2006.01)

(52) U.S. Cl. .................. 510/175; 510/176; 510/407; 510/506

(58) Field of Classification Search ................ 510/175, 510/176, 407, 506
See application file for complete search history.

(56) References Cited

U.S. PATENT DOCUMENTS

| | | | | |
|---|---|---|---|---|
| 4,956,115 A * | 9/1990 | Van De Mark | ............... | 510/206 |
| 5,362,608 A * | 11/1994 | Flaim et al. | ................. | 430/327 |
| 5,498,765 A * | 3/1996 | Carpenter et al. | ........... | 430/323 |
| 6,183,942 B1 * | 2/2001 | Kim et al. | .................... | 430/331 |
| 6,316,160 B1 * | 11/2001 | Shao et al. | ............... | 430/271.1 |
| 6,531,267 B2 * | 3/2003 | Oberlander | ................. | 430/327 |
| 6,846,612 B2 * | 1/2005 | Deshpande | ............. | 430/271.1 |
| 6,962,769 B2 * | 11/2005 | Shao et al. | ............... | 430/271.1 |
| 2003/0113673 A1 * | 6/2003 | Ahn et al. | .................... | 430/331 |
| 2004/0048196 A1 * | 3/2004 | Shao et al. | ............... | 430/271.1 |
| 2004/0229762 A1 * | 11/2004 | Rutter, Jr. | ................... | 510/175 |

* cited by examiner

*Primary Examiner*—Gregory E Webb
(74) *Attorney, Agent, or Firm*—Venable LLP; Raymond J. Ho

(57) ABSTRACT

A photo resist stripper composition includes PGME or its derivatives and ANONE or its derivatives characterized by low toxicity, safe use, free of odors, environment friendly, easy disposal of waste liquid and wastewater; good solution to photo resist material film, proper volatility, excellent stripping capability, good compatibility among different types of photo resist; allowing storage at ambient temperature, low production cost, and not requiring retrofit of the existing equipment.

2 Claims, No Drawings

PHOTO RESIST STRIPPER COMPOSITION

BACKGROUND OF THE INVENTION (a) Field of the Invention

The present invention is related to a photo resist stripper composition, and more particularly to one with a designation of EZ Series solvent comprised of propylene glycol monomethyl ether (PGME) or its derivatives, and cyclohexanone (ANONE) or its derivatives.

(b) Description of the Prior Art

In the manufacturing of microcircuit pattern to be used in the LCD circuit or semiconductor circuit, an insulation film or conduction metal film on the substrate is covered or coated with a photo resist comprised of epoxy, photoactive compound and solvent. The substrate is then oven dried at lower temperature to vaporize the solvent, selectively exposed to certain type of radiation including UV, electronic or X-ray, oven dried again at higher temperature, dipped in developer solution to create the expected pattern, and eroded to strip off residual photo resist on the insulation or the conduction metal film to complete the transfer of the micro-pattern to the surface of the substrate.

Whereas the distribution of the photo resist film on the edges of the substrate is not consistent when compared to that in the central area of the substrate, the unevenly distributed photo resist film or beads (formed by the lumps of the photo resist) in the chip must be removed to rinse the substrate. Currently, there are chemical and mechanical methods to remove the excessive photo resist or beads; however, either method apparently fails the expected results. Physical damage with losing of the material is taken for granted when the solidified film is mechanically stripped off. On the other hand, if the chemical method including rinse, clean or thinning with clean solvent is used, the photo resist stripper composition of the prior art usually contains Methyl isobutyl ketone (MIBK). MIBK though providing sufficient clean capacity, it is toxic to the human health and the environment, and its use is restricted in ISO 14000 Environmental Control Certification. Therefore, searching for a composition to substitute the MIBK is a must.

U.S. Pat. No. 4,983,490 discloses a type of photo resist stripper composition including from about 1 to about 10 of Propylene glycol mono-methyl ether (PGME) by weight and from about 1 to about 10 of Propylene glycol mono-methyl ether acetate (PGMEA) by weight. However, the clean results of the composition are found poor with certain types of photo resist and both of the solubility and vaporization rate are comparatively low. Furthermore, there are many types of photo resist compositions have been taught in U.S. Pat. Nos. 5,814,433; 5,849,467; 6,117,623, and 6,524,775. Additional to those compositions of mixed PGME and PGMEA, the photo resist stripper compositions (also known as ACS, Array clean solvent) popularly used in the trade also include the one-part n-Butyl Acetate (nBAc), or Isoamyl acetate (IAAc), or mixture of PGME, PGMEA and nBAc applied as coater cup rinse, glass substrate for edge bead remover (EBR), and tube clean in equipment.

Other than the price, many factors are taken into consideration in selecting a photo resist stripper composition that is harmless to human health, not affecting the social ecology, free of odors, fast and completely removing solidified or not yet matured photo resist film on the substrate, and giving excellent compatibility with various mixtures of photo resist without creating contamination or damage.

SUMMARY OF THE INVENTION

The primary purpose of the present invention is to provide a photo resist stripper composition that provides good solubility, proper volatility, and excellent rinse capability.

Another purpose of the present invention is to provide a photo resist stripper composition that can be stored at ambient temperature, low product cost, and not requiring change in the existing equipment and production conditions.

Another purpose yet of the present invention is to provide a photo resist stripper composition that gives good compatibility with different photo resist stripper mixtures without causing unexpected poor effects upon the changed manufacturing process.

Another purpose yet of the present invention is to provide a photo resist stripper composition that is extremely low toxic to human health, safe to use, and without odors.

Another purpose yet of the present invention is to provide a photo resist stripper composition that is environment friendly and allows easy treatment of its waste liquid and wastewater.

To achieve these purposes, the present invention is comprised of PGME or its derivatives and ANONE or its derivatives. Wherein, the ANONE may be replaced with compound of ANONE derivative in a structure to be selected form Formula 2; and PGME, with PGME derivative from Formula 1. The composition ratio of ANONE and PGME by weight ranges from 5%:95% to 95%:5%; and the preferred ratio, 20%:80% to 40%:60%. The present invention may be applied in coater cup rinse, glass substrate for edge bead remover (EBR), and tube clean in equipment. The substrate is selected from Si wafer, glass substrate, metal film on glass substrate, SiOx film on glass, SiNx film on glass substrate and Si film on glass substrate. The present invention can be used in cleaning both positive and negative photo resists.

DETAILED DESCRIPTION OF THE PREFERRED EMBODIMENTS

Depending on the pattern reserved after rinse, the photo resist is available in positive photo resist and negative photo resist. Usually the photo resist is applied either by dipping, atomized spray, rotation or spinning method semiconductor substrate or LCD substrate. Substrate materials may include Si wafer, glass, metal film on glass, SiOx film on glass, SiNx film on glass, and Si film on glass substrates. Once the photo resist is coated on the substrate, particularly in using the spinning method, the area where the photo resist is unevenly distributed on the substrate will develop beads from the solidified lumps of the photo resist.

The present invention is applied by the atomized spray method on the substrate to dissolve the beads for paying the consistently distributed photo resist film. The rinse process may be carried out after the oven drying processes respectively at lower and higher temperature. The substrate coated with the photo resist when oven dried at a temperature 20~100° C., the solvent of the photo resist is vaporized without disintegrating the solid composition in the photo resist to such extent that most of the solvent are vaporized to leave a thin film of the photo resist on the substrate.

The substrate coated with the photo resist is selectively exposed to a radiation such as the UV, electronic or X-ray and a proper mask to avail the pattern needed. The exposed substrate is then dipped in a developer solution containing alkali until the exposed or unexposed area of the photo resist (depending on whether the photo resist is of positive or negative type) is practically all, if not completely, dissolved before removing the substrate with the photo resist on its exposed or not exposed area removed from the developer solution. The substrate is then oven dried at higher temperature to improve the adhesion of the photo resist film and its chemical resisting performance. The developed substrate is put under the process of wet erosion or plasma erosion for its exposed area, followed with the disposal of the residual photo resist that protects the screened area of the substrate by using an eluant to strip off the photo resist film on the substrate after the erosion process so to completely transfer the pattern on the surface of the substrate.

TABLE 1

Toxicity Test

| Solvent | TWA (ppm) | STEL (ppm) | Toxicology Data |
|---|---|---|---|
| MIBK | 50 | 75 | $LD_{50}$/Oral/Mouse: 2080 mg/kg |
| | | | $LD_{50}$/Hypodermic/Rabbit: 20 mg/kg or more |
| | | | $LC_{50}$/Inhale/Mouse: 23300 mg/m$^3$ |
| | | | $LC_{50}$/Inhale/Rat: 4000 ppm |
| nBAc | 150 | 200 | $LD_{50}$/Oral/Rat: 14000 mg/kg |
| | | | $LC_{50}$/Inhale/Rat: 2000 ppm (4 hrs.) |
| PGME | 100 | N.A. | $LD_{50}$/Oral/Rat: 6600 mg/kg |
| | | | $LD_{50}$/Hypodermic/Rat: 13000 mg/kg |
| | | | $LC_{50}$/Inhale/Rat: 15000 ppm (7 hrs.) |
| PGMEA | 100 | N.A. | $LD_{50}$/Oral/Rat: 8532 mg/kg |
| | | | $LD_{50}$/Hypodermic/Rat: 5000 mg/kg |
| | | | $LC_{50}$/Inhale/Rat: 4345 ppm (6 hrs.) |

TWA (Time Weighted Average): refers to the concentration in average practically all the employees are continuously exposed to eight hours a day and 40 hours a week without suffering negative impacts.

STEL (Short Time Exposure Limit): refers to the concentration of short time exposure (15 minutes) that the employee is subject to without getting faint or irritated to cause accident and reduced work efficiency.

$LD_{50}$ (Lethal Dosage 50): refers to the dosage that is lethal to 50% animal under test.

$LC_{50}$ (Low Lethal Concentration): refers to the minimum concentration of the mass in the air that is lethal for the exposure less than 24 hours ever reported on man or animal.

N.A.: Not Available

In selecting a proper photo resist stripper, factors considered include extremely low toxicity, safe in use, free of odors, environment friendly, and easy treatment of the waste liquid and wastewater. Tables 1 and 2 respectively show the toxicity test and explosion test results of solvents of the prior art containing MIBK (the conventional photo resist stripper), nBAc, PGME, and PGMEA.

TABLE 2

Ignition & Explosion Tests

| Solvent | Vaporizing Speed | Steam Pressure (mmHg/°C.) | Flash Point (°C.) | Boiling Point (°C.) | Ignition Point (°C.) | Explosion Limit (%) |
|---|---|---|---|---|---|---|
| MIBK | 1.57 | 16/20 | 18 | 115 | 449 | 1.4~7.5 |
| nBAc | 0.98 | 7.8/20 | 22 | 126 | 425 | 1.7~15 |
| PGME | 0.66 | 6.7/20 | 32 | 120 | N.A. | 2.7~11.8 |
| PGMEA | 0.34 | 3.8/20 | 42 | 146 | 354 | 1.5~7 |

Table 3 shows the toxicity, explosion, and chemical property test results of various solvents respectively containing PGMEA, PGME, ANONE, nBAc and IAAc). As indicated in the Tables 1, 2, and 3, the performance of ANONE and PGME used in the present invention gives the same good biological, physical and chemical safe property as that of PGME, PGMEA or nBAc.

TABLE 3

Toxicity, Explosion & Chemical Property Tests

| Solvent | LD50 | LC50 | Flash Point (°C.) | Boiling Point (°C.) | Vaporizing Point (°C.) | Viscosity (cst) |
|---|---|---|---|---|---|---|
| PGMEA | 8532 | 4345 | 47 | 146 | 3.8 | 1.1 |
| PGME | 6600 | 15000 | 32 | 120 | 11.8 | 1.8 |
| ANONE | 1535 | 8000 | 44 | 155 | 4 | 2.2 |
| nBAc | 13100 | 2000 | 22 | 126 | 15 | 0.7 |
| IAAc | 16600 | N.A. | 25 | 142 | 4 | N.A. |

Table 4 shows 15 photo resist stripper compositions at different mixing ratio by weight of those five solvents stipulated in Table 3. Wherein, No. 8 and No. 9 prescriptions relate to those photo resist strippers having been commercialized. Table 5 shows the dissolving capabilities of the photo resist strippers listed in Table 4 for three photo resists already commercialized and applied in the LCD manufacturing process. It is found that (1) Nos. 1~7 prescriptions comprised of PGMEA and ANONE indicate poor solubility to those three types of photo resist, and thus are excluded for consideration. (2) No. 10 prescription refers to the prescription of IAAc alone and is found with the lowest solubility to those three types of photo resist, therefore, is also excluded for consideration. (3) Nos. 11~15 prescriptions containing the composition of the present invention show the solubility to those three types of photo resist same as or better than those two strippers (Nos. 8 and 9) generally available in the market. Wherein, the preferred ratio of ANONE and PGME by weight ranges between 20%:80% and 40%:60%.

TABLE 4

Photo Resist Stripper Composition by % Weight

| No. | PGMEA | PGME | ANONE | nBAc | IAAc |
|---|---|---|---|---|---|
| 1 | 100 | | 0 | | |
| 2 | 90 | | 10 | | |
| 3 | 85 | | 15 | | |
| 4 | 80 | | 20 | | |
| 5 | 70 | | 30 | | |
| 6 | 50 | | 50 | | |
| 7 | 0 | | 100 | | |
| 8 | 30 | 70 | | | |
| 9 | | | | 100 | |
| 10 | | | | | 100 |
| 11 | | 20 | 80 | | |
| 12 | | 40 | 60 | | |
| 13 | | 60 | 40 | | |
| 14 | | 80 | 20 | | |
| 15 | | 100 | 0 | | |

Photo active compound (PAC) in the photo resist can be easily resided on the substrate thus to contaminate the subsequent process. In the photo resist stripper composition of the present invention includes the prescription of PGME and ANONE, ANONE provides excellent solubility to PAC under normal temperature and pressure. According to lab test, it is found that ANONE is capable of completely dissolving the photo resist containing 4~6% (% by weight) of PAC while all other four types of solvent listed in Table 4 fail to. Wherein, the solubility of PGME is slightly better than that of PGEMA.

TABLE 5

Photo Resist Stripper Solubility Test

| No. | Type 1 Photo Resist Solubility (Å/sec.) | Type 2 Photo Resist Solubility (Å/Sec.) | Type 3 Photo Resist Solubility (Å/Sec.) |
|---|---|---|---|
| 1 | 2311.4 | 3473.7 | 3657.4 |
| 2 | 2379.6 | 3647.8 | 3624.2 |
| 3 | 2529.5 | 4020.4 | 3837.9 |
| 4 | 3014.4 | 4644.7 | 4134.8 |
| 5 | 3537.0 | 5657.4 | 5424.1 |
| 6 | 3730.6 | 5446.5 | 5389.2 |
| 7 | 3965.5 | 6441.6 | 5712.3 |
| 8 | 8712.8 | 13094.1 | 13205.9 |
| 9 | 4494.5 | 7018.9 | 7791.5 |
| 10 | 1042.5 | 174.6 | 1947.9 |
| 11 | 8296.1 | 10435.0 | 9919.6 |
| 12 | 8885.2 | 11390.8 | 11078.1 |
| 13 | 10670.9 | 13739.4 | 12091.4 |
| 14 | 11485.5 | 13614.5 | 13458.3 |
| 15 | 10235.4 | 15931.9 | 13818.8 |

Though Table 5 shows the test results of the photo resist stripper comprised PGME and ANONE, it can be appreciated that PGME derivatives of PGME and ANONE derivatives may be used as the composition of the photo resist stripper of the present invention. Formula 1 shows partial structures respectively of PGME and its derivative.

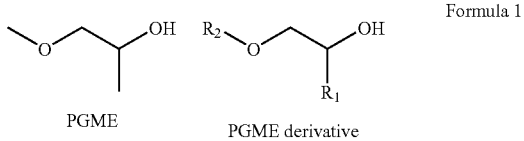

Formula 1

PGME          PGME derivative $R_1$: an Alkyl group which has from 1 to 4 carbon atoms
$R_2$: an Alkyl group which has from 1 to 3 carbon atoms Formula 2 shows partial structures respectively of ANONE and its derivative.

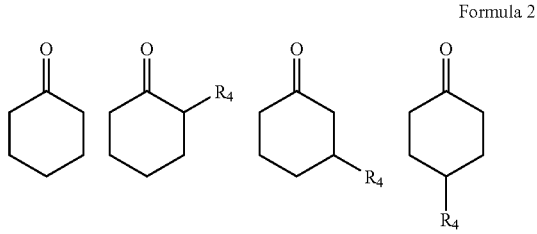

Formula 2

-continued

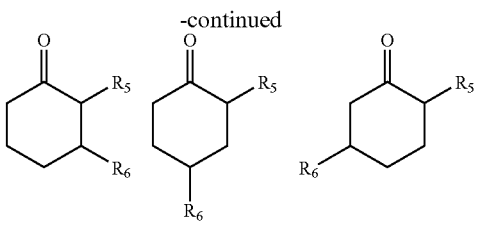

$R_4$: an Alkyl group which has from 1 to 3 carbon atoms
$R_5$: an Alkyl group which has from 1 to 3 carbon atoms
$R_6$: an Alkyl group which has from 1 to 3 carbon atoms The present invention essentially provides a photo resist stripper composition containing PGME or its derivatives and ANONE or its derivatives at a ratio between ANONE and PGME ranging from 5%:95% to 95%:5% by weight with the preferred ratio ranging from 20%:80% to 40%:60%. Benefits of the present invention include (1) extremely low toxicity to human health, save to use, and free of odors; (2) environment friendly, allowing easy treatment of its waste liquid and wastewater; (3) good solubility to photo resist, proper volatility, excellent rinse capability; and (4) can be stored at ambient temperature, lower production cost, change of the existing equipment and production conditions not required.

The prevent invention provides an improved composition of photo resist stripper, and the application for a utility patent is duly filed accordingly. However, it is to be noted that that the preferred embodiments disclosed in the specification and the accompanying drawings are not limiting the present invention; and that any construction, installation, or characteristics that is same or similar to that of the present invention should fall within the scope of the purposes and claims of the present invention.

What is claimed is:

1. A photo resist stripper composition consists of propylene glycol mono-methyl ether (PGME) and cyclohexanone (ANONE), wherein the preferred mix ratio by % weight between ANONE and PGME is 30%: 70%, the photo resist stripper is applied as an edge bear remover (EBR) for substrate, a coater cup rinse, and a tube cleaner in equipment, and the substrate consists of that of Si wafer, glass, metal film on glass, SiOx film on glass, SiNx film on glass and Si film on glass.

2. The photo resist stripper composition of claim 1, wherein the photo resist stripper is used in cleaning both of positive photo resist and negative photo resist.

* * * * *